US010833653B1

(12) United States Patent
Sperling et al.

(10) Patent No.: US 10,833,653 B1
(45) Date of Patent: Nov. 10, 2020

(54) VOLTAGE SENSITIVE DELAY

(71) Applicant: International Business Machines Corporation, Armonk, NY (US)

(72) Inventors: Michael Sperling, Poughkeepsie, NY (US); Akil Khamisi Sutton, Dutchess County, NY (US); Pawel Owczarczyk, Highland, NY (US); Erik English, Beacon, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/578,597

(22) Filed: Sep. 23, 2019

(51) Int. Cl.
*H03K 3/011* (2006.01)
*H03K 19/003* (2006.01)
*H03K 3/037* (2006.01)
*H03K 3/03* (2006.01)
*H03B 5/04* (2006.01)
*H03K 5/00* (2006.01)

(52) U.S. Cl.
CPC .............. *H03K 3/011* (2013.01); *H03B 5/04* (2013.01); *H03K 3/037* (2013.01); *H03K 3/0315* (2013.01); *H03K 19/00323* (2013.01); *H03K 19/00369* (2013.01); *H03K 19/00384* (2013.01); *H03K 2005/0013* (2013.01); *H03K 2005/00143* (2013.01)

(58) Field of Classification Search
CPC ...... H03K 3/011; H03K 3/0315; H03K 3/037; H03K 19/00323; H03K 19/00369; H03K 19/00384; H03K 2005/00143; H03K 2005/0013; H03B 5/04
See application file for complete search history.

(56) References Cited

U.S. PATENT DOCUMENTS

| | | | | | |
|---|---|---|---|---|---|
| 4,128,816 | A | * | 12/1978 | Shimotsuma | G04G 19/06 323/313 |
| 4,308,496 | A | * | 12/1981 | Nagano | G05F 3/30 323/315 |
| 4,918,336 | A | * | 4/1990 | Graham | H03K 19/01853 326/117 |

(Continued)

FOREIGN PATENT DOCUMENTS

| CN | 100428616 C | 10/2008 |
|---|---|---|
| CN | 1938932 B | 9/2010 |

(Continued)

OTHER PUBLICATIONS

Erik English et al., "Voltage Sensitive Current Circuit," U.S. Appl. No. 16/578,613, filed Sep. 23, 2019.

(Continued)

*Primary Examiner* — Thomas J. Hiltunen
(74) *Attorney, Agent, or Firm* — Cantor Colburn LLP; William Kinnaman

(57) ABSTRACT

Aspects of the invention include a circuit including a power circuit having an amplifier, a resistor, a current source, and a first node, one end of the resistor being configured to couple to a power supply, the first node being coupled to an opposite end of the resistor, a first input terminal of the amplifier, and the current source. A voltage sensitive circuit includes a logic gate coupled to both a second input terminal of the amplifier and an output terminal of the amplifier at a second node.

20 Claims, 2 Drawing Sheets

(56) References Cited

U.S. PATENT DOCUMENTS

| | | | | |
|---|---|---|---|---|
| 5,081,380 | A * | 1/1992 | Chen | H03K 5/133 |
| | | | | 323/312 |
| 5,197,033 | A * | 3/1993 | Watanabe | G11C 5/14 |
| | | | | 365/189.07 |
| 5,510,729 | A * | 4/1996 | Reymond | H03K 19/00384 |
| | | | | 326/31 |
| 5,610,547 | A * | 3/1997 | Koyama | G06G 7/24 |
| | | | | 327/350 |
| 6,137,720 | A * | 10/2000 | Lancaster | G11C 16/30 |
| | | | | 365/185.11 |
| 6,496,056 | B1 * | 12/2002 | Shoji | H03K 3/011 |
| | | | | 327/543 |
| 6,686,792 | B2 | 2/2004 | Nakamiya | G04G 19/00 |
| | | | | 327/378 |
| 6,882,238 | B2 * | 4/2005 | Kurd | G01K 7/32 |
| | | | | 331/185 |
| 7,321,242 | B2 | 1/2008 | Mandegaran et al. | |
| 7,525,345 | B2 * | 4/2009 | Jang | H03K 19/0013 |
| | | | | 326/83 |
| 7,911,282 | B2 | 3/2011 | Fujino | |
| 8,339,190 | B2 | 12/2012 | Otsuga et al. | |
| 8,648,645 | B2 | 2/2014 | Konstadinidis et al. | |
| 8,841,890 | B2 * | 9/2014 | Ochoa | G06K 19/0715 |
| | | | | 323/226 |
| 8,847,777 | B2 | 9/2014 | Ramaswami | |
| 9,148,057 | B2 | 9/2015 | Kim | |
| 9,229,465 | B2 | 1/2016 | Dhiman et al. | |
| 9,473,127 | B1 | 10/2016 | Azin | |
| 9,634,651 | B1 | 4/2017 | Tseng | |
| 10,270,630 | B2 | 4/2019 | Yun et al. | |
| 2001/0054925 | A1 | 12/2001 | Dally et al. | |
| 2003/0109142 | A1 * | 6/2003 | Cable | G02B 6/4231 |
| | | | | 438/708 |
| 2006/0076993 | A1 | 4/2006 | Teo et al. | |
| 2006/0125529 | A1 | 6/2006 | Laulanet et al. | |
| 2007/0013414 | A1 | 1/2007 | Pallet et al. | |
| 2007/0013454 | A1 | 1/2007 | Ji | |
| 2007/0079147 | A1 | 4/2007 | Pyeon et al. | |
| 2008/0246512 | A1 | 10/2008 | Seth et al. | |
| 2009/0058466 | A1 | 3/2009 | Parks et al. | |
| 2010/0164538 | A1 | 7/2010 | Greimel-Rechling | |
| 2012/0169391 | A1 | 7/2012 | Sofer et al. | |
| 2013/0034139 | A1 | 2/2013 | Khlat et al. | |
| 2013/0169330 | A1 | 7/2013 | Ma | |
| 2013/0314020 | A1 | 11/2013 | Sugie | |
| 2014/0145707 | A1 * | 5/2014 | Tanabe | G01R 19/16547 |
| | | | | 324/76.41 |
| 2014/0292420 | A1 | 10/2014 | Green et al. | |
| 2015/0042386 | A1 | 2/2015 | Bhowmik et al. | |
| 2016/0034014 | A1 | 2/2016 | Turullols et al. | |
| 2017/0060165 | A1 | 3/2017 | Kim et al. | |
| 2018/0302073 | A1 | 10/2018 | Ko et al. | |

FOREIGN PATENT DOCUMENTS

| | | |
|---|---|---|
| CN | 205015388 U | 2/2016 |
| CN | 206331020 U | 7/2017 |
| KR | 101658783 B1 | 9/2016 |

OTHER PUBLICATIONS

Krishnaveni, S. & Bibin Sam Paul, S., "Desing of VCO Using Current Mode Logic With Low Supply Sensitivity," Feb. 2014, vol. 3, Issue 2, IJRET: International Journal of Reasearch in Engineering and Technology, pp. 528-530.

List of IBM Patents or Patent Applications Treated as Related; (Appendix P); Date Filed: Sep. 23, 2019, 2 pages.

Michael Sperling et al., "Droop Detection Using Power Supply Sensitive Delay," U.S. Appl. No. 16/578,588, filed Sep. 23, 2019.

Michael Sperling et al., "Voltage Starved Passgate With IR Drop," U.S. Appl. No. 16/578,622, filed Sep. 23, 2019.

* cited by examiner

FIG. 2  200

FORM A POWER CIRCUIT INCLUDING AN AMPLIFIER, A RESISTOR, A CURRENT SOURCE, AND A FIRST NODE, ONE END OF THE RESISTOR BEING COUPLED TO A FIRST VOLTAGE, THE FIRST NODE BEING COUPLED TO AN OPPOSITE END OF THE RESISTOR, A FIRST INPUT TERMINAL OF THE AMPLIFIER, AND THE CURRENT SOURCE, WHEREIN THE FIRST NODE HAS A SECOND VOLTAGE 202

COUPLE A VOLTAGE SENSITIVE CIRCUIT INCLUDING A LOGIC GATE TO BOTH A SECOND INPUT TERMINAL OF THE AMPLIFIER AND AN OUTPUT TERMINAL AT A SECOND NODE, THE VOLTAGE SENSITIVE CIRCUIT BEING CONFIGURED TO PROVIDE AN OUTPUT BASED ON THE SECOND VOLTAGE, THE VOLTAGE SENSITIVE CIRCUIT BEING CONFIGURED TO MODULATE A DELAY IN THE OUTPUT BASED ON A DIFFERENCE BETWEEN THE FIRST VOLTAGE AND THE SECOND VOLTAGE 204

VOLTAGE SENSITIVE DELAY

BACKGROUND

The present invention generally relates to integrated circuits, and more specifically, to voltage sensitive delay.

In an electronic device, power is needed to run the device. Semiconductor devices, such as microprocessors, standalone and embedded memory devices, etc., receive power from a power supply. Microprocessors can execute instructions resulting in certain tasks being performed. In some cases, there can be a current spike or a change in current consumption because of the different instructions executed by the microprocessor, which causes voltage variation or spikes, known as droops on the power supply. This may occur because some instructions might require more power than others. A droop is defined as an output voltage change as a function of time and may include both under-voltage and over-voltage conditions. A voltage droop refers to a loss of supply voltage as a device tries to drive a load. Under certain operating conditions, a voltage droop may lead to an integrated circuit's power supply falling below proper operating levels.

SUMMARY

Embodiments of the present invention are directed to a voltage sensitive delay. A non-limiting example circuit includes a power circuit comprising an amplifier, a resistor, a current source, and a first node, one end of the resistor being configured to couple to a power supply, the first node being coupled to an opposite end of the resistor, a first input terminal of the amplifier, and the current source. Also, the circuit includes a voltage sensitive circuit comprising a logic gate coupled to both a second input terminal of the amplifier and an output terminal of the amplifier at a second node.

A non-limiting example method includes forming a power circuit comprising an amplifier, a resistor, a current source, and a first node, one end of the resistor being configured to couple to a power supply, the first node being coupled to an opposite end of the resistor, a first input terminal of the amplifier, and the current source. Also, the method includes coupling a voltage sensitive circuit comprising a logic gate to both a second input terminal of the amplifier and an output terminal of the amplifier at a second node.

A non-limiting example method of forming a circuit includes forming a power circuit comprising an amplifier, a resistor, a current source, and a first node, one end of the resistor being coupled to a first voltage, the first node being coupled to an opposite end of the resistor, a first input terminal of the amplifier, and the current source, wherein the first node comprises a second voltage. Also, the method includes coupling a voltage sensitive circuit comprising a logic gate to both a second input terminal of the amplifier and an output terminal at a second node.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 2 illustrates a flow diagram of a method for configuring a circuit in accordance with one or more embodiments of the present invention.

Figure 1:
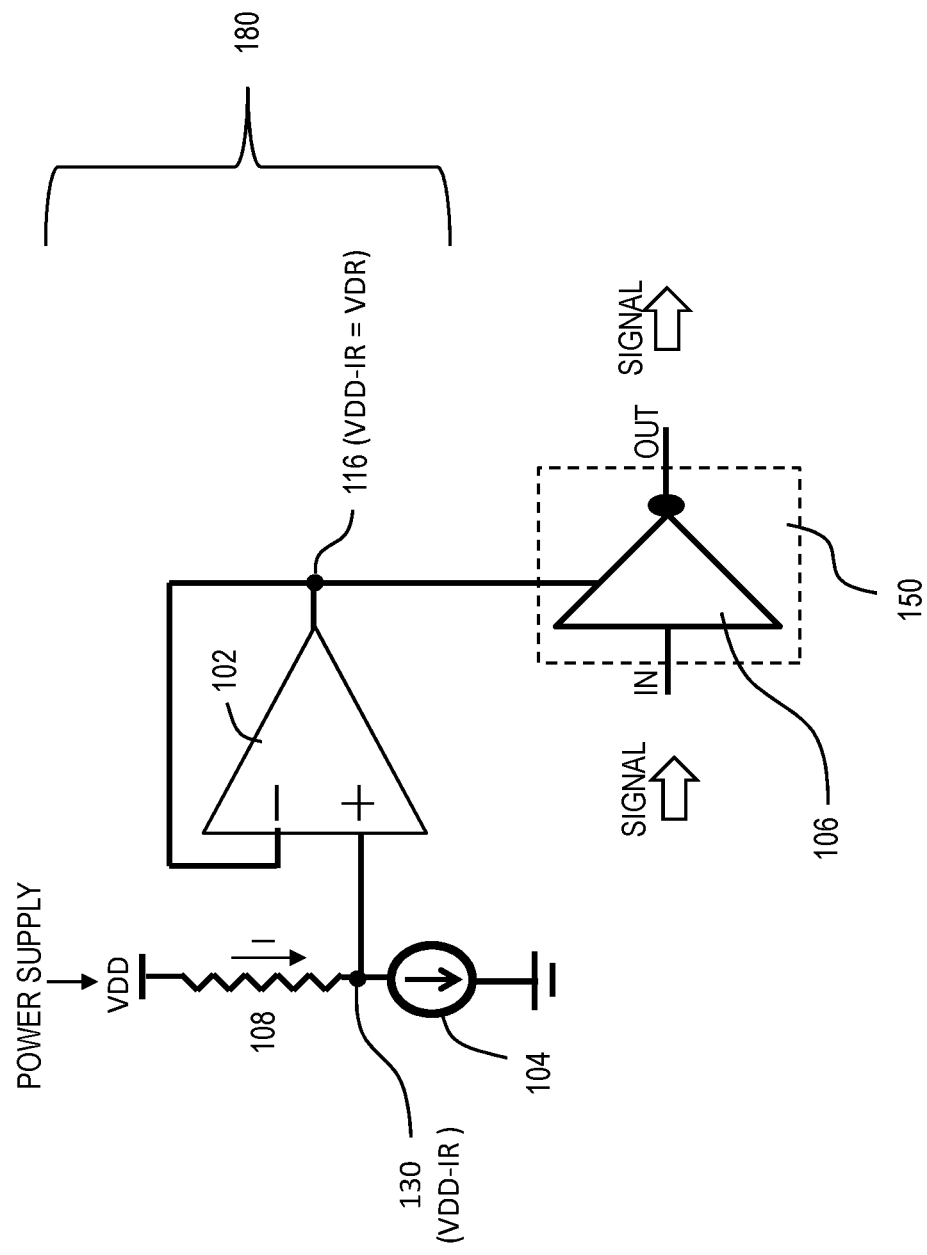
FIG. 1 illustrates a block diagram of an example circuit in accordance with one or more embodiments of the present invention.

The diagrams depicted herein are illustrative. There can be many variations to the diagrams or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

DETAILED DESCRIPTION

One or more embodiments of the present invention provide a delay circuit that makes delay more sensitive to changes in voltage (e.g., voltage VDD) of a power supply. The delay circuit becomes faster (i.e., delay decreases) as the voltage increases, and the delay circuit becomes slower (i.e., delay increases) as the voltage decreases (i.e., voltage drops). One or more embodiments of the invention can be utilized in the fixed delay part of a digital droop sensor. One or more embodiments of the invention amplify the resolution of small voltage drops on a chip. This can result in reducing mismatch, offset, and/or measurement overhead when compared to conventional techniques. One or more embodiments of the invention modulate voltage on a voltage-dependent rail (VDR) for a delay chain of inverters by using an operational amplifier. Thus, the delay chain of inverters becomes a voltage sensitive delay circuit. The operational amplifier modulates the voltage-dependent rail (e.g., voltage VDR), which is the supply voltage, in direct relation to the primary power supply (e.g., voltage VDD). The operational amplifier is utilized to provide voltage regulation to the delay chain of inverters based on a voltage reference that tracks with the primary power supply. In one or more embodiments of the invention, the reference voltage is created as a result of an IR (current (I) times resistance (R)) drop on the primary power supply (e.g., voltage VDD), in which the reference voltage is input to an input terminal of the operational amplifier.

Voltage-insensitive delay is what is typically desired in electronic devices such as microprocessors or processors, meaning that delay of the clock signal is not sensitive to changes in voltage. However, microprocessors need to detect voltage droops or drops in the voltage supply (VDD), and this can be accomplished by making delays sensitive to voltage in accordance with one or more embodiments of the invention. In one or more embodiments, the delay circuit can be utilized in a digital droop sensor that recognizes when the voltage is drooping by making the delay of an on-chip signal, for example a clock signal, increase in relation to a decrease in voltage and vice versa. For example, a clock signal travels through a delay line and (either one or more cycles later) is latched along a string of latches spaced out by minimum delays. The location of the edge (e.g., rising edge or falling edge of a cyclical waveform) of the clock signal in the string of latches is a proxy for the power supply voltage, as changes in power supply slow down or speed up the delays along the path.

Referring to FIG. 1, a circuit 100 is illustrated for providing voltage sensitive delay in accordance with one or more embodiments of the present invention. The circuit 100 is a delay circuit which makes delay more sensitive to changes in voltage of a power supply (e.g., voltage VDD) by having voltage sensitive circuit 150 controlled by changes in a voltage VDR at a voltage-dependent rail identified as node 116. The voltage sensitive circuit 150 includes a delay element 106 coupled to a power circuit 180. Although the delay element 106 is illustrated as an inverter (e.g., a NOT gate), it should be appreciated that other types of logic gates can be utilized. Although one delay element 106 is illustrated in FIG. 1, it should be appreciated that more delay elements can be utilized and operatively connected in FIG. 1 with each having its input connected to the output of the next delay element 106, thereby forming a chain of delay elements 106 or forming a ring oscillator.

The circuit 100 includes a power circuit 180 configured to sense a drop (or change) on primary power supply (e.g., voltage VDD) while translating the change in voltage VDD using a resistor 108 and current source 104 coupled to an operational amplifier 102. The operational amplifier 102 has its noninverting/positive (+) input terminal connected to node 130. The node 130 connects to one end of resistor 108 and to the input of current source 104. The other end of resistor 108 is connected to a voltage supply to receive voltage VDD. A voltage drop of voltage VDD minus I*R (resistance (R) times current (I)) occurs at node 130 (e.g., VDD-IR). The inverting/negative (−) input terminal and output terminal of operational amplifier 102 are connected together at node 116, which can be considered a voltage-dependent rail, to supply voltage VDR. The operational amplifier 102 is configured to reflect or duplicate the voltage at the noninverting/positive (+) input terminal to its output terminal, such that node 116 has voltage VDR where VDR=VDD−IR. Node 116 is connected to delay element 106, thereby supplying voltage VDR to the delay element 106.

By the resistor 108 and current (I) causing the voltage drop down from voltage VDD and by the operational amplifier 102 reflecting the voltage VDR to its output at node 116, a drop in voltage VDD of the power supply is seen as an even larger percentage voltage drop at voltage VDR at node 116 by voltage sensitive circuit (inverter) 150, thereby increasing the delay in the delay element 106 by a larger percentage as compared to any delay caused without adding the additional drop in voltage VDD. By using the current source 104 rather than a resistor divider for the voltage reference at node 130, any change in the power supply is directly transferred to the reference voltage, rather than only a ratio of the change. The current source 104 may also be set to be a voltage sensitive current (sensitive to changes in voltage VDD), thereby increasing the sensitivity further. A signal through delay element 106 of voltage sensitive circuit 150 has a delay that is in direct relation to the change in voltage VDD. Particularly, a change in voltage VDD is duplicated onto the lower value voltage VDR, such that the change is a larger percentage of the voltage VDR as compared to the change relative to the power supply VDD. Therefore, the delay element will either decrease or increase delay more than if it were coupled to the power supply (e.g., voltage VDD).

FIG. 2 illustrates a flow diagram of a method 200 for configuring or forming a circuit in accordance with one or more embodiments of the present invention. At block 202, the method 200 includes forming a power circuit (e.g., power circuit 180) including an amplifier (e.g., operational amplifier 102), a resistor (e.g., resistor 108), a current source (e.g., current source 104), and a first node (e.g., node 130), one end of the resistor being coupled to a first voltage (e.g., voltage VDD), the first node being coupled to an opposite end of the resistor, a first input terminal (e.g., noninverting/positive terminal (+)) of the amplifier, and the current source, wherein the first node has a second voltage (e.g., voltage VDR). At block 204, the method 200 includes coupling a voltage sensitive circuit (e.g., voltage sensitive circuit 150) including a logic gate (e.g., delay element 106) to both a second input terminal (e.g., inverting/negative terminal (−)) of the amplifier and an output terminal at a second node (e.g., node 116), the voltage sensitive circuit being configured to provide an output based on the second voltage, the voltage sensitive circuit being configured to modulate a delay in the output based on a difference between the first voltage and the second voltage.

In accordance with one or more embodiments of the invention, the voltage sensitive circuit is configured to provide the output with an increased delay responsive to a decrease in the second voltage and configured to provide the output with a decreased delay responsive to an increase in the second voltage.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

One or more of the methods described herein can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There can be many variations to the diagram or the steps (or operations) described therein without departing from the spirit of the disclosure. For instance, the actions can be performed in a differing order or actions can be added, deleted or modified. Also, the term "coupled" describes having a signal path between two elements and does not imply a direct connection between the elements with no intervening elements/connections therebetween. All of these variations are considered a part of the present disclosure.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A circuit comprising:
   a power circuit consisting of an amplifier, a resistor, a single voltage sensitive current source coupled directly to ground, and a first node, one end of the resistor being configured to couple to a power supply, the first node consisting of only three connections in which a first connection is to an opposite end of the resistor, a second connection is to a first input terminal of the amplifier, and a third connection is a single line to only one terminal of the voltage sensitive current source; and
   a voltage sensitive circuit comprising a logic gate coupled to both a second input terminal of the amplifier and an output terminal of the amplifier at a second node, the voltage sensitive current source having been set to be sensitive to voltage changes in the power supply, thereby causing a sensitivity of the voltage sensitive circuit to directly follow the voltage changes in the power supply changes.

2. The circuit of claim 1, wherein the voltage sensitive circuit is configured to provide an output based on being coupled to the second node.

3. The circuit of claim 1, wherein the voltage sensitive circuit is configured to provide an output with an increased delay responsive to a decrease in voltage from the power supply.

4. The circuit of claim 3, wherein the voltage sensitive circuit is configured to provide the output with a decreased delay responsive to an increase in the voltage from the power supply.

5. The circuit of claim 1, wherein the logic gate comprises an inverter.

6. The circuit of claim 1, wherein the amplifier comprises an operational amplifier.

7. The circuit of claim 1, wherein the first input terminal is a noninverting terminal and the second input terminal is an inverting terminal.

8. A method of forming a circuit, the method comprising:
   forming a power circuit consisting of an amplifier, a resistor, a single voltage sensitive current source coupled directly to ground, and a first node, one end of the resistor being configured to couple to a power supply, the first node consisting of only three connection in which a first connection is to an opposite end of the resistor, a second connection is to a first input terminal of the amplifier, and a third connection is a single line to only one terminal of the voltage sensitive current source; and
   coupling a voltage sensitive circuit comprising a logic gate to both a second input terminal of the amplifier and an output terminal of the amplifier at a second node, the voltage sensitive current source having been set to be sensitive to voltage changes in the power supply, thereby causing a sensitivity of the voltage sensitive circuit to directly follow the voltage changes in the power supply changes.

9. The method of claim 8, wherein the voltage sensitive circuit is configured to provide an output based on being coupled to the second node.

10. The method of claim 8, wherein the voltage sensitive circuit is configured to provide an output with an increased delay responsive to a decrease in voltage from the power supply.

11. The method of claim 10, wherein the voltage sensitive circuit is configured to provide the output with a decreased delay responsive to an increase in the voltage from the power supply.

12. The method of claim 8, wherein the logic gate comprises an inverter.

13. The method of claim 8, wherein the amplifier comprises an operational amplifier.

14. The method of claim 8, wherein the first input terminal is a noninverting terminal and the second input terminal is an inverting terminal.

15. A method of forming a circuit, the method comprising:
    forming a power circuit consisting of an amplifier, a resistor, a single voltage sensitive current source coupled directly to ground, and a first node, one end of the resistor being coupled to a first voltage, the first node consisting of only three connections in which a first connection is to an opposite end of the resistor, a second connection is to a first input terminal of the amplifier, and a third connection is a single line to only one terminal of the voltage sensitive current source, wherein the first node comprises a second voltage; and
    coupling a voltage sensitive circuit comprising a logic gate to both a second input terminal of the amplifier and an output terminal at a second node, the voltage sensitive current source having been set to be sensitive to voltage changes in the power supply, thereby causing a sensitivity of the voltage sensitive circuit to directly follow the voltage changes in the power supply changes.

16. The method of claim 15, wherein the voltage sensitive circuit is configured to provide an output based on the second voltage.

17. The method of claim 16, wherein the voltage sensitive circuit is configured to modulate a delay in the output based on a difference between the first voltage and the second voltage.

18. The method of claim 15, wherein the voltage sensitive circuit is configured to provide an output with an increased delay responsive to a decrease in the first voltage.

19. The method of claim 15, wherein the logic gate comprises an inverter.

20. The method of claim 15, wherein:
    the amplifier comprises an operational amplifier;
    the first input terminal is a noninverting terminal; and
    the second input terminal is an inverting terminal.

* * * * *